US011280820B2

(12) United States Patent
Brainard, II et al.

(10) Patent No.: US 11,280,820 B2
(45) Date of Patent: Mar. 22, 2022

(54) CORONA DETECTION SYSTEM AND METHOD

(71) Applicant: Woods Hole Oceanographic Institution, Woods Hole, MA (US)

(72) Inventors: Edward C. Brainard, II, Marion, MA (US); Hans J. Weedon, Salem, MA (US)

(73) Assignee: WOODS HOLE OCEANOGRAPHIC INSTITUTION, Woods Hole, MA (US)

( * ) Notice: Subject to any disclaimer, the term of this patent is extended or adjusted under 35 U.S.C. 154(b) by 0 days.

(21) Appl. No.: 16/627,317

(22) PCT Filed: Aug. 2, 2019

(86) PCT No.: PCT/US2019/044840
§ 371 (c)(1),
(2) Date: Dec. 29, 2019

(87) PCT Pub. No.: WO2020/028771
PCT Pub. Date: Feb. 6, 2020

(65) Prior Publication Data
US 2021/0333311 A1    Oct. 28, 2021

Related U.S. Application Data

(60) Provisional application No. 62/713,989, filed on Aug. 2, 2018.

(51) Int. Cl.
*G01R 29/08* (2006.01)
*G01R 29/12* (2006.01)
(Continued)

(52) U.S. Cl.
CPC ............. *G01R 29/08* (2013.01); *G01R 29/12* (2013.01); *G01R 29/24* (2013.01); *G01W 1/16* (2013.01); *G08B 21/18* (2013.01)

(58) Field of Classification Search
CPC ........ H01L 21/00; H01L 2221/00; G01R 1/00
See application file for complete search history.

(56) References Cited

U.S. PATENT DOCUMENTS 3,787,707 A * 1/1974 Gregg .................... H02H 7/003
361/113
4,823,228 A    4/1989 Bittner
(Continued)

OTHER PUBLICATIONS

F.O. McMillan, "Radio Interference from Insular Corona", Electrical Engineering, 1932, pp. 3-9.
(Continued)

*Primary Examiner* — Jermele M Hollington
*Assistant Examiner* — Temilade S Rhodes-Vivour
(74) *Attorney, Agent, or Firm* — Douglas Denninger

(57) ABSTRACT

A system and method for detecting electrical events, often a corona associated with an impending lightning strike, including a coupling mechanism configured to establish an electromagnetic connection with a conductive substrate to receive signals intercepted by the conductive substrate. A detector circuit converts and discriminates the received signals into output signals. An output mechanism records and/or transmits the output signals, as well as determines if the output signal represents a qualified event signal.

19 Claims, 8 Drawing Sheets

(51) Int. Cl.
*G01R 29/24* (2006.01)
*G01W 1/16* (2006.01)
*G08B 21/18* (2006.01)

(56) References Cited

U.S. PATENT DOCUMENTS

| | | | |
|---|---|---|---|
| 5,977,762 | A | 11/1999 | Murtha, Jr. et al. |
| 6,232,882 | B1 | 5/2001 | Hed et al. |
| 7,796,370 | B1 | 9/2010 | Wruple |
| 8,593,289 | B1 | 11/2013 | Carlisle |
| 2005/0116166 | A1* | 6/2005 | Krichtafovitch ........ H01T 19/00 250/324 |
| 2005/0197776 | A1 | 9/2005 | Makela et al. |
| 2012/0154971 | A1 | 6/2012 | Brashear |
| 2012/0271564 | A1* | 10/2012 | Dudley ............. G01R 29/0842 702/34 |
| 2016/0161543 | A1* | 6/2016 | Andle ................ G01R 31/1272 324/551 |
| 2018/0239991 | A1* | 8/2018 | Weller .................... G06F 17/18 |

OTHER PUBLICATIONS

R.L. Johnson et al., "An Operational Comparison of Lightning Warning Systems", Amer. Meteor. Soc., 1982, pp. 703-707, vol. 21.

K. Rinnert et al., "Measurements of the RF Characteristics of Earth Lightning With the Galileo Probe Lightning Experiment", J. Geophysical Res., 1985, pp. 6239-6244, vol. 90, No. D4, Amer. Geophysical Union.

David M. Le Vine, "Review of Measurements of the RF Spectrum of Radiation from Lightning", NASA Tech. Memorandum 87788, 1986, pp. 1-15.

T. Gregory Lewis et al., "An Analysis of the Frequency Characteristics O Corona Discharge at Low Pressure", 1991, Thesis, Phillips Lab., Directorate of Advanced Weapons and Survivability, Air Force Systems Command, Kirtland Air Force Base, NM 87117-6008, 83 pp.

U. Finke et al., "Review of existing lightning location systems", Report Part 1, Detect and Locate Lightning Events from Geostationary Satellite Observations, 2002, 43 pp.

Jakke Makela, "Electromagnetic Signatures of Lightning Near the HF Frequency Band", Thesis, 2009,Finnish Meteor. Institute, Finland, 100pp.

Marley Recerra, "Glow corona generation and streamer inception at the tip of grounded objects during thunderstorms: revisited", J. Phys. D: Applied Phys. 2013, 135205, 13pp.

* cited by examiner

CORONA DETECTION SYSTEM AND METHOD

CROSS-REFERENCE TO RELATED APPLICATION

This application claims priority to U.S. Provisional Application No. 62/713,989 filed on Aug. 2, 2018. The entire contents of the above-mentioned application is incorporated herein by reference.

FIELD OF THE INVENTION

This invention relates to the detection of corona discharges and the protection of electrical equipment in a potential lightning strike zone. In particular, this invention relates to the detection of corona discharges relating to the build-up of electrical charge preceding a lightning strike. In some embodiments, this invention provides a mechanism and method to protect electrical equipment and alert personnel of the impending lightning strike.

BACKGROUND OF THE INVENTION

Lightning is a well-known, dangerous natural phenomenon. Lightening is a threat to life and wellbeing of not only people, but also electrical equipment. The ability to detect lightning strikes at a distance is well known, and enables persons to avoid an area experiencing lightning, or to seek shelter before a storm arrives. However, it is not practical to move large or important electrical equipment when a lightning storm approaches. Mechanically disconnecting properly grounded electrical equipment affords some protection to the equipment from lightning strikes. However, with the uncertainty of currently known lightning detectors, critical equipment may need to be disconnected for an unacceptably long amount of time.

Lightning is a complex process, resulting in a sudden electrostatic discharge, Of importance to this disclosure, lightning discharges can occur between electrically charged regions of atmosphere (e.g. thunder clouds) and the surface, including ground, water, or a structure attached to the surface). Before a lightning strike, a charge imbalance exists between the atmosphere (i.e. the lightning origin) and the ground (i.e. the lightning target), which is equalized through the discharge.

Although lightning is complex and not completely understood, it can be broken into several known components, including a corona, an upward streamer, a stepped leader and a return stroke. Leaders are bidirectional channels of ionized air and are electrically conductive channels of ionized gas that are attracted to regions with opposite charge of the leader's tip. As leaders grow, they often split into branched, tree-like patterns and are referred to as stepped leaders. One leader of a multiple branched stepped leader may exit the cloud and be directed to the inductively-charged ground.

As the negative charge builds in the atmosphere, a background electrical fields builds close to ground level. This background electrical field builds from roughly 100 V per meter (m) to up to a few tens of kilovolts per meter. Corona discharges spontaneously initiate from points on the ground (often sharp, or distinct elevated points). Corona discharges occur in two forms, first, glow coronas that are thin, bright plasma with continuous current and second, streamer coronas that are sequences of filamentary ionized channels with pulsating current.

As the stepped leader propagates downward, it induces an increasingly large electrical field at ground level, which superimposes over the cloud's electric field. If the fields are strong enough, the corona discharges will build, to produce a positively charged ionic channel, termed an upward streamer (also referred to as upward leaders). Once the positive upward streamer and negative down leader make contact, a low-resistance path is formed through which the lightning current may be discharged to the ground—resulting in a lightning strike.

It is well established that lightning strikes radiate electromagnetic energy. A lightning strike can be broken into a return stroke and multiple re-strikes. Sensors that detect and measure lightning activity are well known in the art, but most often measure radiated energy originating from either just the return stroke, or both the return stroke and re-strikes.

For example, a system to discriminate a lightning strike from other, man-made electrical sources and is disclosed in U.S. Pat. No. 5,977,762, which relies on detecting re-strikes. Furthermore, lightning detectors that rely on stroke-generated signals are also well known in the art.

Lightning detection based on developing coronas and corona discharges are less well known. Corona detectors were first developed in the 1980s, but underperformed for storm approach warnings, much less individual lightning strike predictors (Johnson et al. 1982). During that time Bittner et al. U.S. Pat. No. 4,823,228 disclosed a corona generator that actively induced a corona by supplying RF signals onto an antenna to measure odd harmonics resonating from the stimulated antenna. Bittner relies on a substantially vertical, pointed rod or antenna to produce an artificial corona when supplied with an even RF harmonic and their system produces a warning when the amplitude of the supplied harmonic is increased. Such a system is limited because it must actively produce an RF signal onto an attached antenna of a given height. A system that passively monitors corona build up would be a substantial improvement.

Corona formation is difficult to measure, but has been modelled in silico (for more details see Becerra et al. 2013, incorporated by reference herein) and limited measurements have been conducted in the laboratory (D'Alessandro et al., 1999). Generally, modelled corona current builds over a time scale of 10s of seconds (depending on the physical dimensions of the local high point, such as a tree, mast, rod, antenna, and etc.) and the current builds from a low baseline (less than 0.1 mA) to a corona peak of around an order of magnitude higher (1-2 mA). Laboratory measurements demonstrate corona currents ranging from too small to detect upwards to about 100 micro-ampere ($\mu A$) for different gaps between overhead charge and corona point and corona point dimensions as a function of applied electric field.

Coronas and corona discharges also occur from other, non-lightning sources, for example electrical power transmission line hardware and stations. Such non-lightning corona discharges (NLCD) have the same governing physical laws as lightning corona discharges (LCD), but significantly different properties. NLCD produce electromagnetic interference, and can be seen in Reddy et al. "Correlation between corona current and radio interference due to high voltage insulator string," Proceedings of the 2012 Electrostatics Joint Conference, poster presentation 2012, S7. NLCDs also pose a threat to electrical equipment and may disrupt electricity delivery in power transmission system.

Because the first return stroke itself is the most dangerous risk to people and electrical equipment, a lightning detector that relies on the signal produced by the return stroke, the re-strikes, or a combination thereof would be of little use to anyone or anything in the ground target area subject to the first lightning strike.

Therefore, there is a need for a detector that can accurately predict a future lightning strike at a target location before a first strike occurs at that location.

SUMMARY OF THE INVENTION

An object of the present invention is to provide an early warning system for potential lightning strikes utilizing existing RF-conductive material on structure such as a vessel to serve as an RF antenna for the system.

Another object of the present invention is to provide a less-expensive technique for detecting potential lightning strikes and protecting electronic equipment.

One such detector that can accurately predict a future lightning strike at a target location is described herein, utilizing the build-up of corona current to predict future lightning strikes. The disclosed invention takes advantage of electromagnetic energy, often in the radio frequency (RF) spectrum, imparted in any partially conductive wire or material to monitor local, ground-level corona build-up that are predictive of future lightning strikes and to alert a user and to mechanically disconnect attached electronic equipment before the strike.

This invention may be expressed as a system and method for detecting corona build-up, including a signal receiver configured to establish an electromagnetic connection with an RF-conductive material on a structure to receive signals captured by the RF-conductive material, and a transformer to convert the received signals to transformed signals. A detector is configured to receive the transformed signals to detect corona build-up.

This invention features a system for detecting electrical events in an environment, the system including a conductive substrate capable of intercepting electromagnetic signals from the environment across a selected spectrum of frequencies. A coupling mechanism establishes an inductively-coupled electromagnetic connection with the conductive substrate to receive at least one intercepted electromagnetic signal from the conductive substrate. A detector circuit includes a first transforming module configured to select a first frequency from the at least one intercepted signal, and to convert the selected first frequency into at least one selected signal. An output mechanism is electrically connected to the detector circuit to receive the at least one selected signal and is configured to produce at least one of (i) a perceptible warning. (ii) a warning signal, or (iii) a stored signal.

In some embodiments, the detector circuit further includes (A) a second transforming module, configured to select a second frequency from the at least one intercepted signal and to convert the selected second frequency to at least one second selected signal, and (B) a logic module which receives the at least one selected signal and the at least one second selected signal, and produces at least one output signal which is sent to the output mechanism. In certain embodiments, the logic module includes a logic gate having a first input and a second input and connected to the output mechanism, the first input connected to the first transforming module and the second input connected to the second transforming module. The first input receives the at least one selected signal from the first transforming module and the second input receives the at least one second selected signal. In some embodiments, the coupling mechanism has at least inductive and resistive frequency ranges across the selected spectrum of frequencies, and the coupling mechanism receives the at least one intercepted electromagnetic signal within the inductive frequency range. In one embodiment, the coupling mechanism is a split core ferrite transformer.

In certain embodiments, the system further includes a protection mechanism physically connected with at least one connection of at least one piece of electronic equipment and the protection mechanism is adapted to mechanically disconnect the at least one connection when a warning signal is sent to the protection mechanism from the output mechanism. In another embodiment, the detector circuit further comprises an enhancement module configured to shunt excess intercepted electromagnetic signal via signal-to-ground conduction. In one embodiment, the detector circuit further comprises an input module, wherein the input module receives the intercepted signal, producing at least one input signal and provides the at least one input signal to the transforming module, and the transforming module performs permeability tuning of the intercepted signal to produce at least one passed signal.

In one embodiment, the output mechanism comprises a data logger and a digital display. In another embodiment, the output mechanism comprises a communications system to transmit the warning signal. In certain embodiments, the output mechanism qualifies the at least one output signal according to at least one test criteria to produce one of a qualified event signal or a non-qualified event signal.

This invention also features a method of detecting electrical events, including the steps of selecting a device comprising a coupling mechanism configured to receive electromagnetic signals across a selected spectrum of frequencies, and a detector circuit including a first transforming module configured to select a first frequency from a received electromagnetic signal and to convert the selected first frequency into at least one selected signal. The method includes connecting the device to an output mechanism configured to receive at least one signal from the detector circuit, and coupling the coupling mechanism with an inductive connection to a conductive substrate found in the environment, the conductive substrate capable of intercepting electromagnetic signals from the environment. The method further includes intercepting electromagnetic signals from the environment with the coupling mechanism, producing at least one signal from the detector circuit, and receiving the at least one signal with the output mechanism.

In certain embodiments, the method further includes qualifying the at least one signal according to at least one test criteria by the output mechanism, and producing one of a qualified event signal or a non-qualified event signal. In another embodiment, the device is selected to include a protection mechanism and the method further includes the step of physically disconnecting at least one connection from at least one piece of electronic equipment utilizing the protection mechanism. In certain embodiments, the coupling mechanism has at least inductive and resistive frequency ranges across the selected spectrum of frequencies, and the coupling mechanism receives the at least one intercepted electromagnetic signal within the inductive frequency range. In one embodiment, the output mechanism further comprises an interconnected communications system and the method further includes the step of communicating the at least one signal to a remote station. In another embodiment, the detector circuit further comprises an enhancement module configured to shunt excess selected signal to ground. In yet another embodiment, the method further includes shunting excess selected signal to ground.

In some embodiments, the detector circuit further comprises an input module; wherein the input module receives the intercepted signal, producing at least one input signal and provides the at least one input signal to the transforming module, the transforming module performs permeability tuning of the intercepted signal, producing the at least one selected signal. In one embodiment, the detector circuit further includes (A) a second transforming module, configured to select a second frequency from the at least one intercepted signal and to convert the selected second frequency to at least one second selected signal, and (B) a logic gate comprising a first and a second input and connected to the output mechanism, the first input connected to the first transforming module and the second input connected to the second transforming module. The first input receives the at least one selected signal from the first transforming module and the second input receives the at least one second selected signal and wherein the logic gate produces at least one output signal, sending the at least one output signal to the output mechanism.

BRIEF DESCRIPTION OF THE DRAWINGS

In what follows, preferred embodiments of the invention are explained in more detail with reference to the drawings, in which.

DEFINITIONS

For the purpose of this disclosure, the term "electrical event of interest" includes localized ionization of a medium (e.g., air) around a conductive substrate (e.g., a conductor). The electrical event of interest often occurs when the strength of the electrical field around the conductive substrate forms a conductive region such as lightning-induced coronas, non-lightning induced coronas, and similar electrical events.

The terms "intercepted energy", "intercepted electromagnetic energy", and "intercepted electromagnetic signal" refer to the energy received by a conductive substrate as an energy field propagates through a medium such as air. Electrically-conductive elements inherently receive energy as energy fields develop or travel through the environment, the inherently received energy is therefore termed the "intercepted energy".

DETAILED DESCRIPTION OF THE PRESENTLY PREFERRED EMBODIMENTS

Overview

The instant invention described herein provides for a system, device and method to detect the build-up of electrical events of interest, typically corona fields, and most typically lightning-associated coronas and the discharge of those coronas. An electrical event of interest (e.g. a corona) develops when the strength of an electrical field (i.e. potential gradient) around a potential conductor is high enough to form a conductive region around said conductor, but not high enough to initiate electrical breakdown or arcing to a nearby object or objects. Electrical breakdown or arcing is referred herein as corona discharge or simply as discharge. Lightning corona discharge (LCD) results in an electromagnetic energy, resulting in radio interference (RI) signals that can be measured utilizing any conductive substrate (e.g. a wire). The present invention provides for a coupling mechanism to interact with an existing conductive substrate for the interception and measurement of electromagnetic frequencies (e.g. radio frequencies, or RF). The device provides a circuit to discriminate electrical events of interest from other electromagnetic sources and, in some embodiments, provides an output mechanism for monitoring, recording or mechanical disconnect of sensitive electrical equipment.

This invention may be expressed as a system and method for detecting the build-up of an electrical event, including a coupling mechanism configured to establish an electromagnetic connection with an conductive material (i.e. the conductive substrate) on a structure to receive signals captured by the conductive material, and a transforming mechanism (i.e. the transforming module) to tune and convert the received signals to transformed output signals. An output mechanism is configured to receive the transformed output signals for recoding or detection and recognition of electrical events of interest (e.g. corona build-up).

Figure 1A:
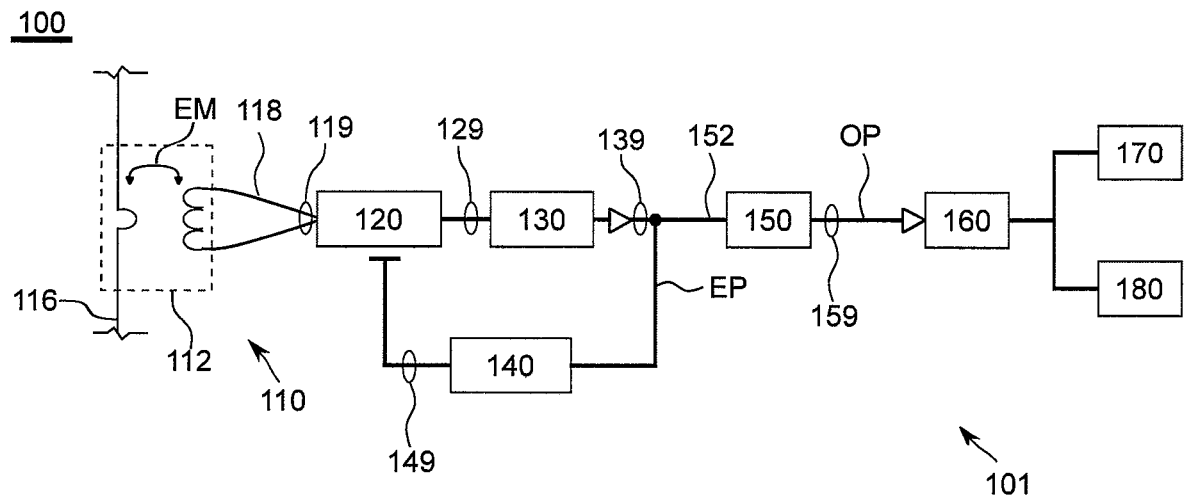
FIGS. 1A-1C are schematic overview diagrams of a system according to the present invention.

As outlined in FIG. 1A, a Corona Detection System 100, has a coupling mechanism 110, a detector circuit 101, an output path OP, an output mechanism 160 and an optional protection mechanism 180. The coupling mechanism 110 provides input to the detector circuit, which in turn is broken down into modules, including the input module 120, transforming module 130, enhancement module 140 and output module 150. Together the detection circuit (referred herein as the circuit) 101 determines which electromagnetic signals represent developing corona, discharging corona, possible lightning strikes, or background noise. The detector circuit 101 activates an output path OP when the correct conditions applies for the embodiment. The output path OP connects to an output mechanism 160, which interprets and records the output, and activates the protection mechanism 180.

The electromagnetic signals are referenced herein separately as they travel through the environment and the circuit 101 for better clarity. The intercepted signals EM are received from the environment by the conductive substrate. A portion of the intercepted signals EM are received by the coupling mechanism, and signals emitting from the coupling mechanism are referred to as input signals 119. The input signals 119 are received by the input module and modified, preferably by at least one resistor into modified signals 129, which are received by the transforming module 130. The transforming module 130 performs selection on these signals producing selected signals 135. The selected signals 135 are either converted directly to passed signals 139 or are sent to an optional logic module such as a logic gate LG. In one construction, the logic gate LG converts the selected signals 135 to passed signals 139 according to its logic circuit. Passed signals 139 are sent to the output module 150 and the enhancement module 140. The enhancement module produces modulating signals that affect the voltage of the signal in the input module 120. And the output module 150 produces output signals 159, which are sent to the output mechanism 160.

Conductive Substrate 116

The present invention provides a device and system to detect corona build-up and discharges by utilizing an existing, suitable component commonly available to a user. This component, referred herein as the conductive substrate 116 may be any suitable component, wire, contained liquid and the like, as long as it at least partially conductive or otherwise capable of propagating an electrical field. Preferably, the conductive substrate 116 is small enough in one dimension (i.e. its diameter) as to allow the receptacle 112 to surround conductive substrate 116. The conductive substrate 116 inherently intercepts a portion of energy (referred herein as intercepted energy or intercepted electromagnetic signal EM) from passing energy waves or fields as they travel or develop in the environment. Of interest, energy is often intercepted from radio waves from man-made sources. Another intercepted energy EM comes from coronal energy fields induced from lightning or man-made electrical systems. The conductive substrate 116 is preferably sized to allow for monitoring and reception of the intercepted electromagnetic signal EM by the receptacle 112. Typically, conductive substrate 116 is a single turn of wire, often coaxial that acts as a single turn primary. The conductive substrate may be a coaxial or "coax" cable, a stay, electrical power supply wire (e.g., a power cord), mast-top lightning protection wire, or a length of conductive metal.

In one embodiment, the conductive substrate 116 is wiring (e.g., coax cable), most often the only a portion or section (e.g. a short length) of the conductive substrate 116 interacts with the coupling mechanism 110, while the conductive substrate 116 is connected to or comprises a larger wiring network (e.g. the wiring of a sailboat). Existing wiring inherently receives or intercepts energy from the surrounding environment. The specific type and frequency of intercepted energy depends on the geometry, length and inter-connectivity of a given conductive substrate 116. Likewise, the optimal signal type and frequency for the receptacle 112 to monitor depends on the embodiment. In one embodiment, the conductive substrate 116 has optimal resonant behavior in the range of 1 to 5 MHz of radio frequencies. In one embodiment, the conductive substrate 116 acts as a primary in a transformer, where the coupling mechanism 110 acts as the transformer.

Coupling Mechanism 110

The coupling mechanism 110 receives electromagnetic signals and provides input signals 119 into the circuit 101 for event detection. The coupling mechanism 110 comprises a receptacle 112, an optional clamp 114 and an output secondary 118. The receptacle 112 accepts the at least partially conductive substrate 116, most often a wire, which responds to the presence of electrical events of interest. The receptacle 112 receives electromagnetic signals EM from the conductive substrate 116 and is electrically connected to the output secondary 118, which is wound through the receptacle. Output secondary receives output from the receptacle 112. The signal emanating from the receptacle 112 is referred herein as the input signal 119, and is transferred for interpretation by the detection circuit 101 via connector 121. Preferably, output secondary 118 is a single wire, multiple turn secondary with 3 to 4 turns through the receptacle 112 and acts as a transformer secondary. Output secondary 118 has reflected inductance of the receptacle 112, and receives a broad range of frequencies, preferably within 300 kHz to 30 MHz. Connector 121 may be any suitable shielded wire, preferably coax wiring. The receptacle 112 may further comprise an optional clamp 114 that affixes the receptacle 112 securely to the conductive substrate 116. In the currently preferred embodiment, the receptacle 112 is a split ferrite core clamped to a coax cable (i.e. the conductive substrate 116 that is disposed on a boat's mast.

The receptacle 112 is adapted to receive or monitor the electromagnetic energy EM intercepted by the conductive substrate 116. In some embodiments, the receptacle 112 monitors intercepted radio frequency RF energy. Of these embodiment, one embodiment receives frequencies between 30 kHz to 300 MHz. In other embodiments the intercepted energy is 300 kHz to 30 MHz. The primary impedance of the coupling mechanism 110 is low, typically five ohms and with 3 turns of output secondary 118, with five ohms times the three turns squared equaling a total of about 45 ohms.

In some embodiments, the receptacle is affixed in place by a clamp 114, which can be any suitable mechanism to securely attach the receptacle to a conductive substrate 116, while still allowing the electromagnetic signal EM to be monitored by the receptacle 112. In some embodiments, the coupling mechanism 110 is a transformer, with a range of 1 to 10 turn secondary 118.

Receptacle 112 is preferably coupled to the conductive substrate 116 by an inductive coupling connection, protecting the system from electromagnetic signal noise generated by lightning strikes, including both the lightning stroke and re-strikes. Apparatuses with a direct connection (i.e. high impedance) will receive all electromagnetic signals, including those generated by lightning strikes. With an inductive connection between receptacle 112 and conductive substrate 116, a significant portion of the electromagnetic energy in the conductive substrate passes through to the receptacle 112 and circuit 101. However, the inductive coupling enables portions of the electromagnetic spectrum to be removed or filtered out of the circuit without additional component complexity. Furthermore, it is possible to change the frequencies received by the receptacle 112 by changing its characteristics (e.g. number of turns of secondary output wire 118, or the composition of receptacle 112).

The preferred embodiment described herein comprises a receptacle 112 that receives a wide band of frequencies, but not very low frequencies, further preventing energy from lightning strikes to be received by the preferred embodiment. In another embodiment, the receptacle 112 is a ferrite choke that restricts electromagnetic energy of the conductive substrate 116 as it passes through the receptacle 112. This restriction is a function of frequency; the choke's impedance increases as the frequency of the electromagnetic energy flowing through the conductive substrate 116 increases. In these embodiments, the secondary output wire 118 acts as a secondary in a transformer and inductively receives a portion of the electromagnetic energy flowing through the conductive substrate 116. In other words, these embodiments utilize an inventive clip on magnetic core (e.g. ferrite core) transformer choke not to block or otherwise restrict electromagnetic energy, but to pass intercepted electromagnetic energy through to circuit 101.

In yet another embodiment, the receptacle 112 is a ferrite slug and secondary output wire 118 makes between 1-10 turns, typically 3 to 5 turns around ferrite slug receptacle 112. In this embodiment the receptacle acts directly as the conductive substrate 116 and no separate conductive substrate is present.

Detector Circuit 101

Figure 1C:
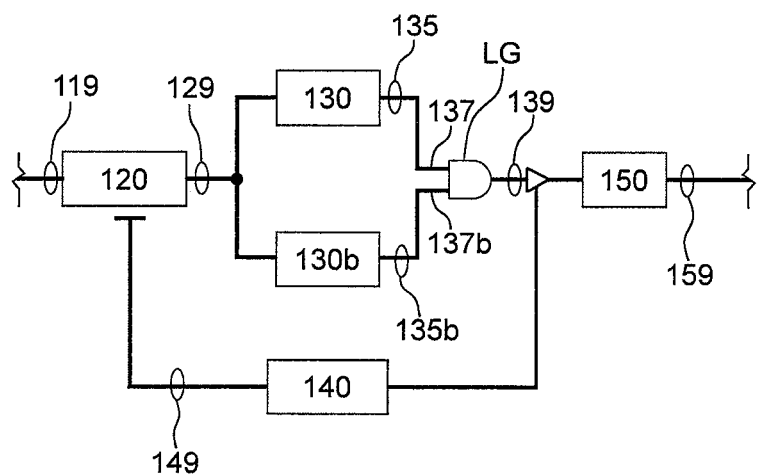
Figure 1B:
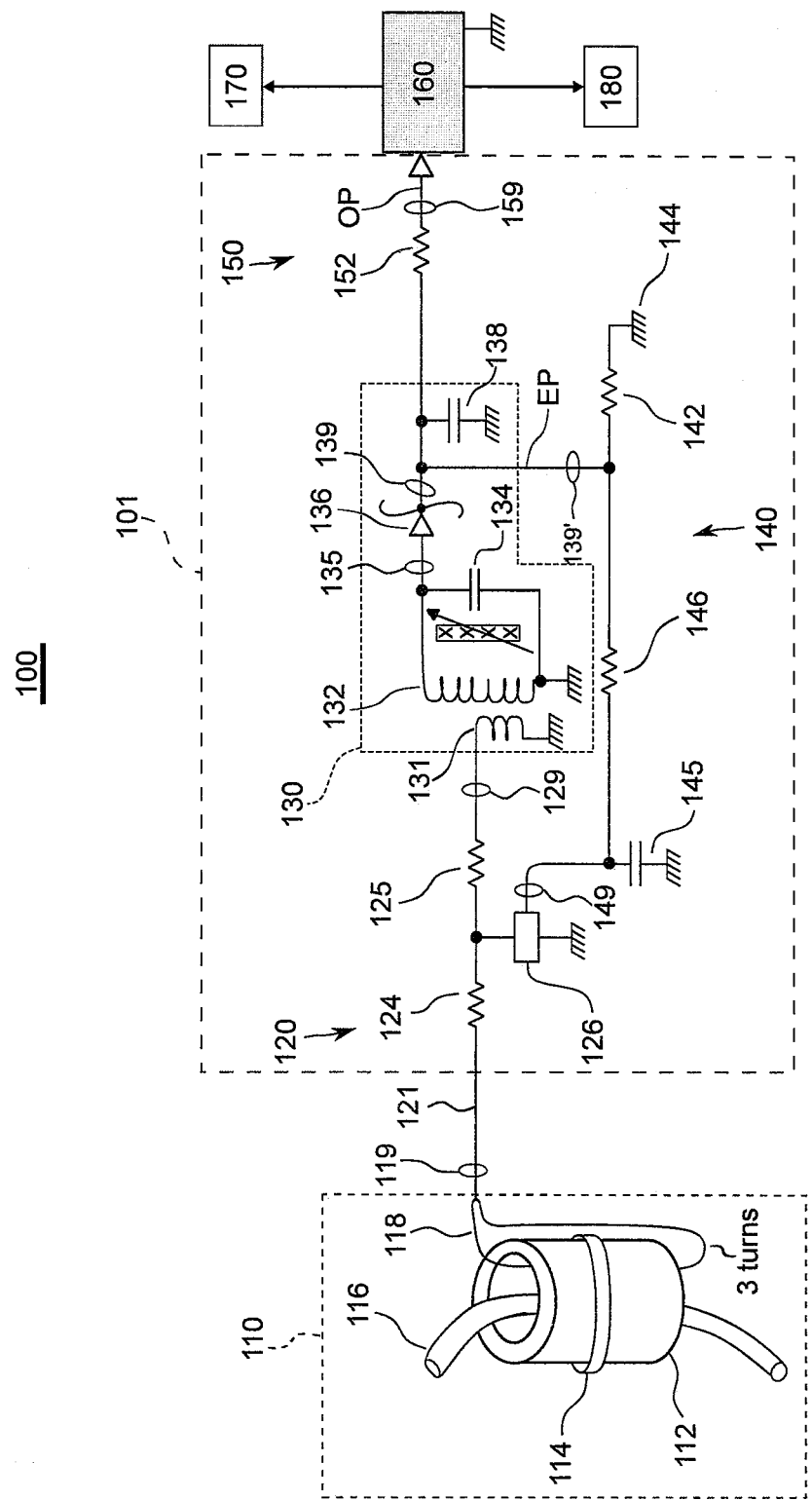

The present invention provides a circuit 101, FIGS. 1A-1B, comprising components to modify, gate, and discriminate the received input signals 119 from the coupling mechanism 110. Signals that match the predetermined qualities are transmitted through the output path OP as output signals 159. The input signals 119 from coupling mechanism 110 are received by input module 120, which comprises a path (e.g. a wire) 121, at least one resistor 124 and gate transistor 126. The input module 120 receives input signals and puts out modified signals 129. In the currently preferred embodiment, two resisters are connected in serial, a first resistor 124 having 33 Ohms resistance and a second resistor 125 having 22 Ohms resistance in one construction. Resistor 125 is typically a shorting resistor, preventing the shorting out of primary 131 and loss of the circuit 101. Resistor 124 terminates wire 121 and therefore secondary 118 at a high frequency so the energy produced by a lightning strike that hits either the system 100, strikes nearby the system 100, or strikes the conductive substrate 116 does not enter and damage the circuit 101. In the currently preferred embodiment, modified signals 129 represent input signals with modified voltages, by resistors 124 and 125.

The signals exiting the input module 120 are modified signals 129, which are delivered to the interconnected transforming module 130. The transforming module 130 receives the modified signal 129 and performs permeability tuning to gate and discriminate the modified signal 129 such that the detector circuit 101 only passes the appropriate signals, producing 'passed signals' 139. Depending on the embodiment, passed signals 139 are either directly converted to output signals 159 and delivered to the output path OP, or are delivered to a logic gate LG, which then produces output signals 159 if the logic is passed, that is, if the logic requirements are met. The appropriateness of the passed signals 139 depend on the embodiment selected by a user, and may be selected with variable turning or other selection in the transforming module 130. The transforming module 130 preferably comprises a step-up transformer 132 configured to resonate at a specified frequency by a negative phase shift impedance capacitor 134. In the preferred embodiment, the step-up transformer 132 resonates at approximately 2.23 MHz and the tuning capacitor 134 is fixed at 220 pF. The primary 131 of transformer 132 optimizes transfer impedance. The selection frequency dictates the number of turns on primary 131 and secondary 118. Preferably primary 131 has 10 turns to and secondary 118 has between 1 and 10 turns, preferably between 3 and 4 turns. Preferably the transformer 132 passes within 50 to 100 ohms. The present invention provides an easily tunable frequency selection method. When selecting a lower tuning frequency, a specific embodiment will comprise more turns on secondary 132 and higher capacitance on tuning capacitor 134. When selecting a higher tuning frequency will comprise less turns on secondary 132 and lower capacitance on tuning capacitor 134.

In other embodiments, the system 100 relies on the presence of a signal on two or more frequencies of the modified signal 129, as illustrated in FIG. 1C. In these embodiments, the transforming module 130 is duplicated, as represented by modules 130 and 130b. Each transforming module 130, 130b receives a single modified signal 129 from an interconnected single input module 120. Each transforming module's output is connected to an electronic logic gate LG, with multiple inputs and electronic switches (e.g. transistors) and configured to act as a logic circuit. Each logic gate input 137 and 137b is triggered when the interconnected primary 131, secondary 132 and capacitor 134 passes a selected signal 135 to the input 137. These embodiments may be configured to only generate a passed signal 139 when the electronic switches from all transforming modules are triggered (e.g. all passing selected signals 135, 135b as an AND logic gate). Alternatively, these embodiments may be configured to only generate a passed signal 139 when a majority, or a plurality (e.g. 2 of 5 transforming modules) of transforming modules pass a passed signal 139 through the logic gate LG.

The received and transformed signal voltage is rectified and peak detected by the diode 136 and stored on the output capacitor 138. The voltage of the output capacitor is outputted to the output mechanism 160 and branches through resistor 146 in the enhancement module 140. In the preferred embodiment the diode 136 comprises a Schottky barrier diode that stores a voltage on a 22000 pF output capacitor 138 and transformer 132 is a variable inductance transducer (i.e. using inductive tuning), which is especially well suited for rugged, wet conditions. In another embodiment, the transforming module 130 comprises a variable capacitance air capacitor to permeability tune the signal. In yet another embodiment, the transforming module 130 utilizes capacitive tuning in place of permeability tuning, especially in embodiments not designed for hostile environments when air capacitors could be damaged by the environment (e.g. salt water from the environment).

The stored voltage of passed signal 139 bridges the transformation module 130 with the output module 150. When an electrical event of interest (e.g. a corona build-up) is detected by the system 100, a stored voltage is developed across capacitor 138 and two electrical paths are passed. The first path is the output path OP with a resistor 152 leading to the output mechanism 160, and the second path is the enhancement path EP leads to the enhancement module 140. The output path OP enables an ideal voltage (i.e. the output signal 159) to be sent to output mechanism 160. In the preferred embodiment, resistor 152 is a 4.7 kOhm current-limiting resistor situated to best protect any downstream elements, and the output mechanism 160 is a digital controller capable of recording the event of interest as well as activating protection mechanism 180.

The second, enhancement path EP comprises a path (e.g. DC voltage) carrying a portion of passed signal 139 into an enhancement module 140 of the circuit 101. The enhancement module 140 enables shunting excess input signal 119 to ground via transistor 126, enabling automatic gain control (AGC) for the system 100. The signal experienced by the system will vary depending on a variety of factors, including the proximity of the device to a developing corona or other event of interest. In addition, noise from electrical equipment may affect the intercepted signal EM, introducing peaks and troughs that are received by the detector circuit 101. The signal fed into transistor 126 is referred herein as the modulating signal 149 and is the signal used to drain the input signal 119 when the conditions in filter capacitor 145 and gate transistor 126 are met. In the currently preferred embodiment, the enhancement circuit 140 comprises a gate transistor 126, preferably 1 V to 2 V gated enhancement mode Metal Oxide Semiconductor Field Effect Transistor (MOSFET). With increasing signal voltage across the filter capacitor 145 and the gate of transistor 126, the N Channel of transistor 126 starts shunting part of the signal 139' to ground. The system is adapted to have a high channel resistance (preferably 0.5 to 5 V), but when the voltage increases above the gate threshold, channel impedance decreases and shunts a portion of the signal 139' to ground. The more positive the gate voltage is, the more of the signal 139' is shunted to ground. This AGC function limits the detected passed signal 139 on the storage capacitor 138 to about 3V for a very large input signal 119. Large signals 119 will primarily be dissipated in the input part of the input module 120, with the residual signal across gate transistor 126 and the input resistor 125. Sufficient passed signal 139 is rectified on the storage capacitor 138 to maintain a balance of output signal 159 from the output module 150 to the output mechanism 160. It should be noted that the commonly known ground symbols used in FIG. 1B, such as the ground symbol 144, represent grounding points to a common ground in the preferred embodiment. Other embodiments may have a plurality of grounding points.

In another embodiment, the enhancement module 140 detects a baseline amplitude, preferably with a minimum and maximum signal level of passed signal 139' over time. The enhancement module 140 creates an adjusting value as the difference from the maximum or minimum value to the baseline amplitude of passed signal 139'. The enhancement module 140 then applies the adjusting value to the gate transistor 126 to drain or supply voltage at the input module 120, modulating the input signal 119, to create a feedback loop circuit.

The transforming module 130 selects and stores passed signals 139 of interest for output to the output mechanism 160, however after the transforming module 130 stores a passed signal 139 with at least capacitor 138, the system would become insensitive to additional events of interest. Therefore, the present invention provides a re-sensitizing mechanism in the AGC and resistor 142 that leads at least to ground 144, allowing the system 100 to detect additional events of interest. The AGC further comprises a low-pass filter 145, a capacitor in the embodiment shown in FIG. 1B, enabling the stabilization of gate transistor 126. Low-pass filter 145 allows the system to respond only to the average of the signal 119 and not to minor changes.

Figure 2:
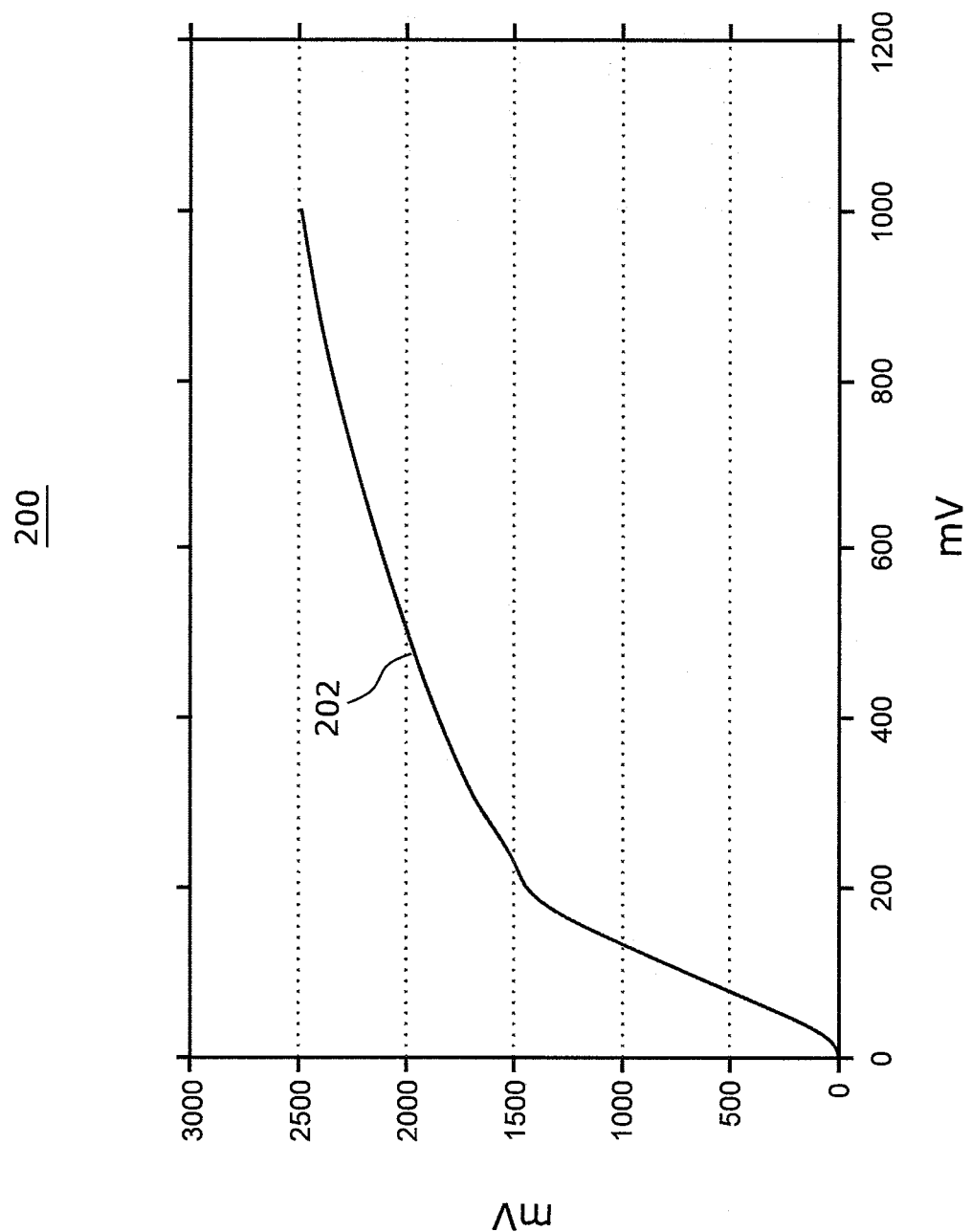
FIG. 2 is a graph illustrating the relationship between the coupling mechanism input signal and the output signal to the output mechanism.

The relationship between the input signal 119, in mV, and the final output signal 159 from the first path OP to the output mechanism 160, in mV DC, is illustrated in FIG. 2. Depending on the embodiment and the environment of the system's deployment, the system's output can be adapted to scale with to a wide range of input and output voltages. FIG. 2 illustrates that with an input voltage (i.e. input signal 119) of about 200 mV, the output voltage (i.e. output signal 159) has reached the lower threshold voltage of the MOSFET gate transistor 126 of 1500 mV (i.e. 1.5 V). As the input signal 119 increases further, the output signal 159 to the output mechanism 160 rises more slowly as the input signal 119 climbs towards one volt, reaching the upper limit of 2.5 V.

In other embodiments, the detector circuit further comprises a resonant circuit, enabling the selection of a frequency or frequency range received from the coupling mechanism to pass on to the rest of the detection circuit. The resonant circuit comprises a tunable inductor and a tunable capacitor, enabling an adjustable frequency to be passed through the resonant circuit to the detector circuit. In some embodiments, the receptacle 112 selects the frequencies to pass to the detection circuit.

Output Mechanism 160

The disclosed system 100 transmits useful output to an output mechanism 160. This mechanism may be any suitable component as desired. In one embodiment, the output mechanism comprises a data logger 170, such data loggers commercially available from Onset Computers located in Bourne Mass., USA, enabling the output to be recorded. In another embodiment, the output mechanism 160 comprises a digital display for displaying the output values, either as numbers, or graphed as illustrated in FIG. 2, or graphed as in FIGS. 3A-3C. In yet another embodiment, the output mechanism is a digital controller or computer as known in the art. In other embodiments, the output mechanism is more than one component, for example a controller and a display.

In some embodiments, the output mechanism 160 further comprises an interconnected communications system. The communications system provides the system the ability to transmit the output signal 159 to a remote location. Most often the communications mechanism is a commonly known wireless system, for example a cellular network system, however the communications mechanism may be any suitable communications system as known in the art.

Protection Mechanism 180

The instant invention provides for a method and system to protect electrical equipment and personnel. Typical personnel protection systems include audio and visual alert systems that inform people in the device's vicinity to move to a safer location or take other protective steps. For example, for boaters to move off of a boat's deck and out of the cockpit, and down to below decks. In another example, golfers are alerted to move off of the open spaces and to nearby shelter when the protection mechanism is activated by the device.

As illustrated in FIGS. 4A-4D, electrical equipment 190 that is protectable by the present invention is any powered device. Typically, a device 190 will have a power source (e.g. battery, plug, or generator) 192 and at least one connection 195 (input or output) to another device. To ensure protection, the instant invention breaks the link between device 190 and power source 192 (or any other device). Ideally this break is mechanical or physical in nature, in other words, the protection mechanism 180 physically and mechanically removes the power source 192 from the equipment 190. Often this disconnect involves physically separating the wiring 194 of the power source 192 from the equipment 190 at a reversible connector 196 and connection receptor 197 by the protection mechanism 180. Disconnection prevents surging, or increases of transient voltage in the wiring 194 from being delivered to the equipment 190 because the equipment is no longer connected to the conductive wiring 194 at connector 196'. Other known systems apply grounding or surge protection to electrical equipment, but such method is inadequate to protect against the power of a direct, or nearly direct lightning strike.

Figure 4A:
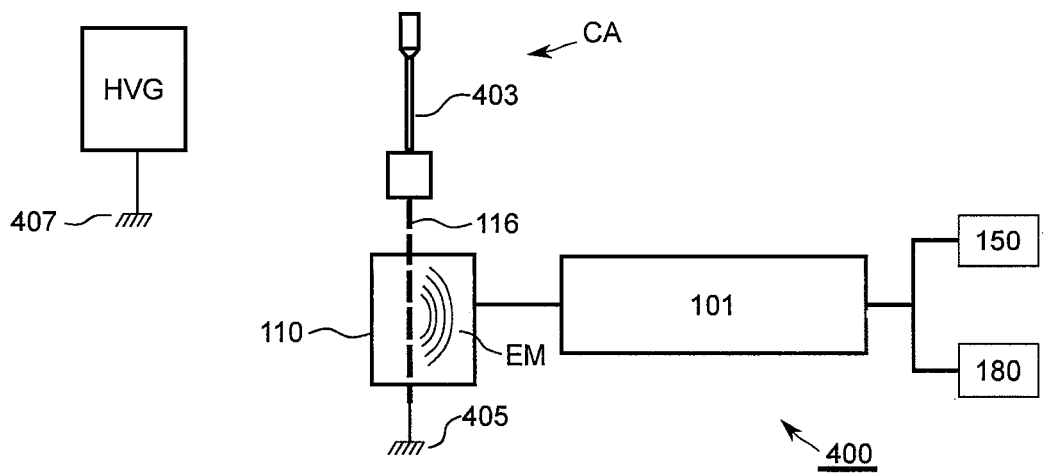
FIG. 4A is an overview diagram of one embodiment of the present disclosure, including a protection mechanism 180.
Figure 4B:
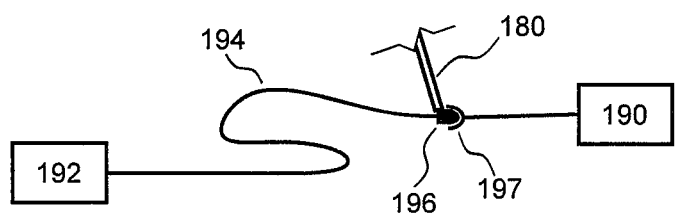
FIGS. 4B-4D illustrate the physical disconnection of a power source to an equipment by the protection mechanism according to some embodiments.
Figure 4C:
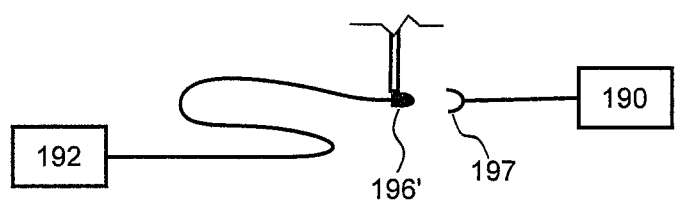
Figure 4D:
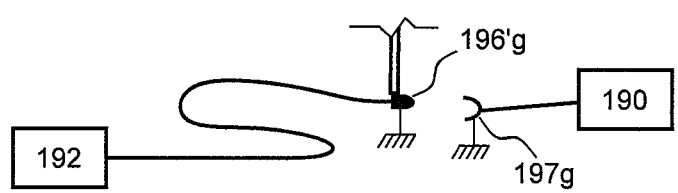

In the currently preferred embodiment, the protection mechanism 180 further grounds connections 194 and 197 after disconnect. Preferably both ends of a connection, connector 196 and connection receptor 197, are grounded, as depicted in FIG. 4D with grounded connect 196'*g* and grounded connection receptor 197*g*. In some embodiments only one end is grounded.

Equipment protection may be performed in any suitable manner. In one embodiment, the protection mechanism comprises an actuator that is coupled to an equipment's power plug, and when activated, moves the actuator to unplug the equipment. After the threat of a lightning strike, the actuator may re-insert the plug. Alternatively, the protection mechanism may sound an 'all-clear' alert, announcing to a user that it is considered safe to plug the equipment back in. In other embodiments, the protection mechanism introduces a break in the electrical supply circuitry of the equipment to be protected. In other embodiments, all or a subset of input cables and wires are disconnected and grounded.

Sampling Conditions

The present invention provides multiple methods for sampling the intercepted electromagnetic energy to detect events of interest. In one embodiment, the output mechanism 160 samples the output signal 159 for 10 seconds. In another embodiment the output mechanism 160 samples and holds the output signal for 10 seconds. Typically to detect coronas, the output mechanism 160 samples at least 5 seconds, and a corona is detected as increasing output signal 159 over a plurality of sampling periods. The sampling period may be any suitable number for the event of interest, preferably a period between 2 to 60 seconds, more preferably a period between 2 to 15 seconds.

The output mechanism 160 may further set conditions, sometimes referred to herein as test criteria, to qualify the output signal 159 over time to qualify as a corona event, or other event of interest. A non-limiting set of possible test criteria will now be discussed as examples. In some embodiments, the output mechanism 160 only qualifies an event (i.e., passes the selected test criteria) with a qualifying signal QS when a selected plurality of output signals 159 meet a user-set voltage threshold in a row without an output signal 159 being less than that threshold. In one embodiment, for example, ten samples must reach or surpass a selected threshold. In other embodiments, the user sets the number of samples (each sample representing a set amount of time of output signals 159, typically 10 seconds each) reaching the threshold for a qualified event to be registered, preferably within 10 to 1,000 samples. Additionally, a user may set a percentage of samples within the set of consecutive samples that may miss the threshold. In other words, a user may set a percentage of samples within a set of consecutive samples that must at least meet the threshold. A user may also set a rate of increase (i.e. slope of output signal 159 line) required for samples above the threshold to trigger a qualifying event.

Example 1

One embodiment will now be shown in more specific detail. Three individual yachts were fitted with systems as illustrated in FIG. 1B and output was recorded on a controller comprising a Measurement Computing Corporation Model 501 Data Loggers, at a 10 second sampling rate. The controller input range is 2.5 volt DC and each controller is capable of running for up to 8 months on a single power source (e.g. two AAA batteries).

Figure 3A:
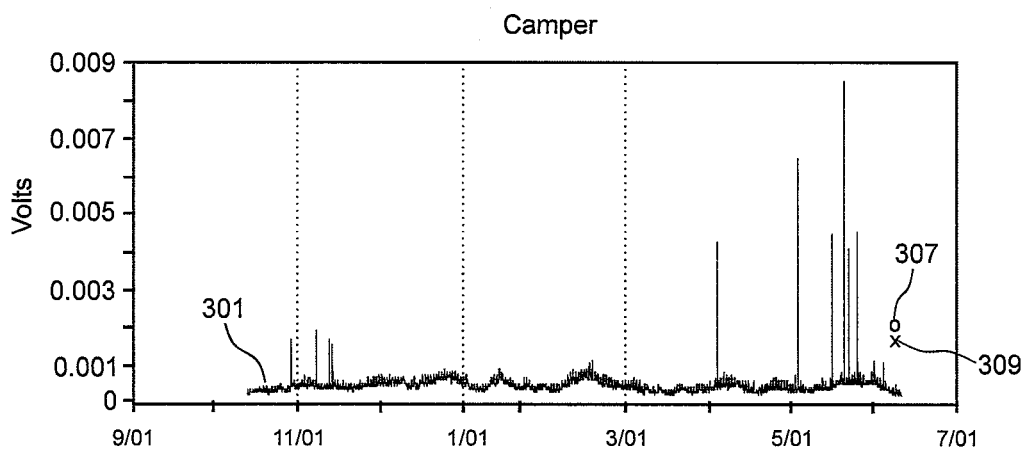
FIGS. 3A-C are graphs representing recordings of embodiments on ocean-going yachts, with FIGS. 3A and 3B being recordings that span approximately 8 months and show no corona build-ups or discharges, and FIG. 3C illustrating one recording of a corona build-up.
Figure 3B:
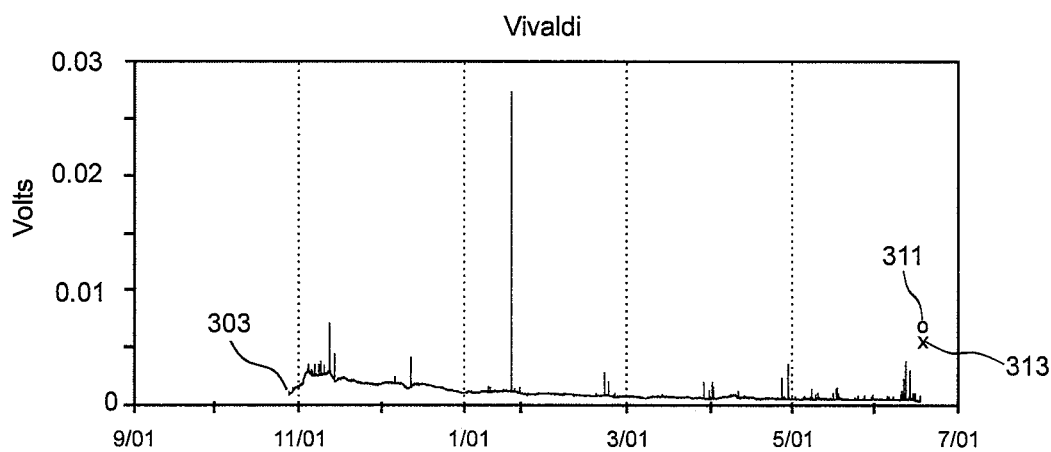
Figure 3C:
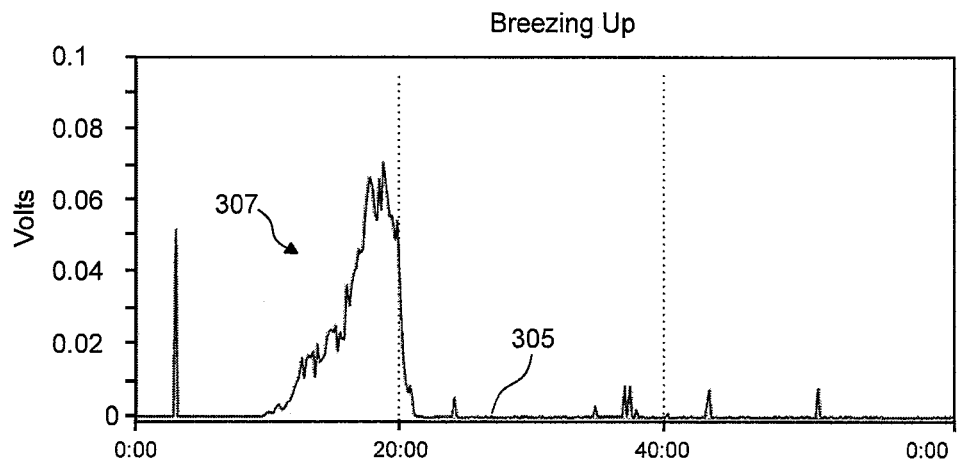
Figure 6:
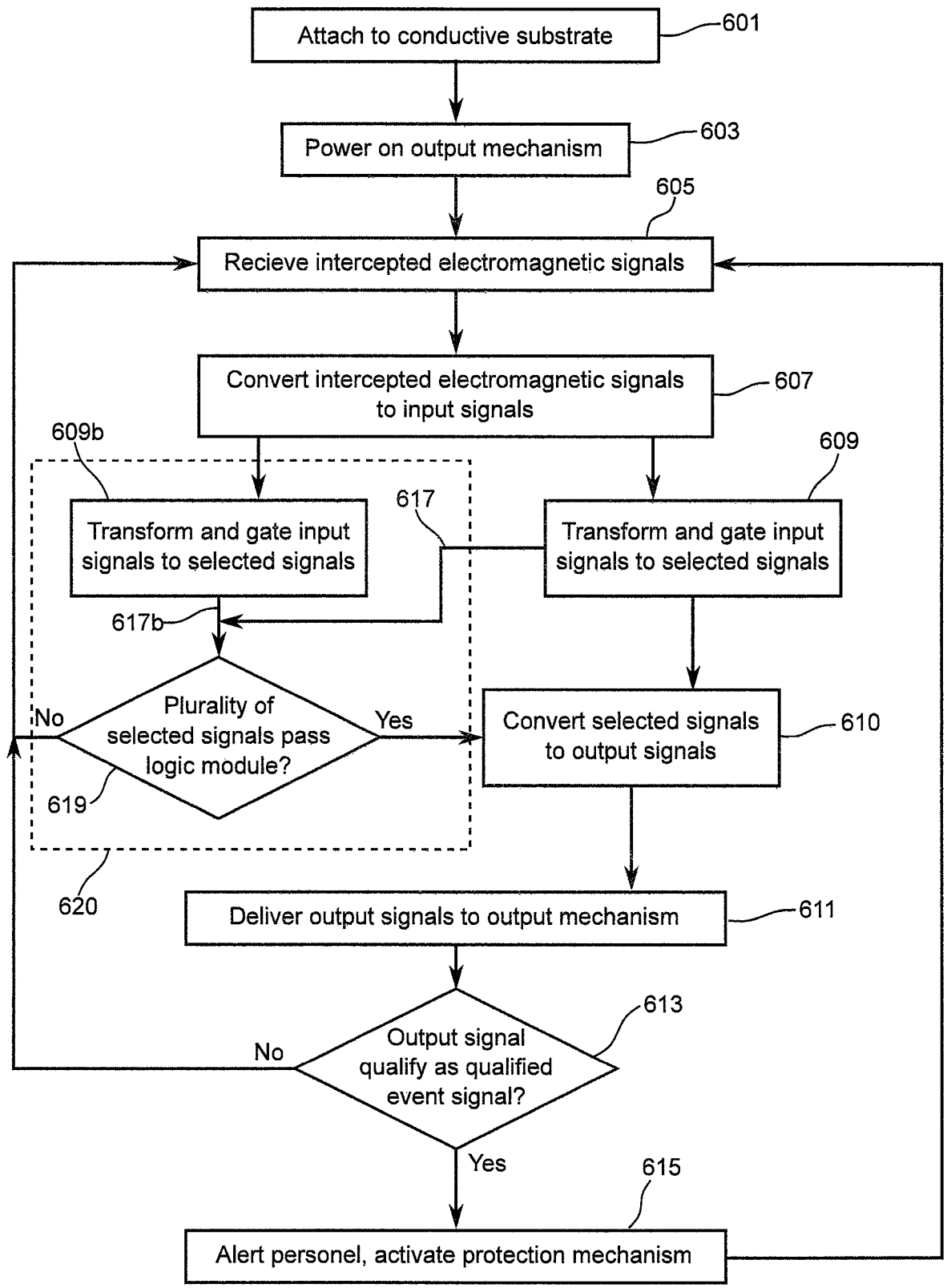
FIG. 6 is a flow chart of one method of using an embodiment of the present disclosure.

The general method of use is depicted in FIG. 6. A coupling mechanism 110 of system 100, also referred to herein as device 100, FIGS. 1A-1C, is fixed to yacht wiring (i.e. the conductive substrate 116, FIGS. 1A-1B), step 601, and a data logger (i.e. output mechanism 180) is powered on, step 603, from its internal power source in one construction. Preferably, the system itself 100 requires no power source, because all necessary power can be obtained from the intercepted electromagnetic signal EM. The device 100 receives any intercepted electromagnetic signals, step 605, converting these signals into input signals, step 607, then into passed signals, step 609, and then to output signals, step 610. The output signals 159 are delivered to the output mechanism, step 611. In this embodiment they are stored on the data logger and optionally displayed on a digital display as shown in FIG. 3A from one deployed device, showing of all output signals 301 over the course of 8 months. Another recording of output signal 303 second deployed device is shown in FIG. 3B. Neither device experienced any active coronas. Potential distant lightning strikes are seen as sharp peaks in both recordings. A corona 307 buildup is recorded as output signals 305 in FIG. 3C, and seen as a build-up of charge over the course of minutes. In this instance build up was over ten minutes and peaked at 0.070 volts. The measured data is expressed in volts which are the rectified output from the system tuned to 2.182 MHz. Corona 307 represents a minor coronal event. A near strike condition would range tout least 5 to 10 times the value seen in FIG. 3C. Cloud discharge and cloud movement rate at which it passes over the device are the main controlling factors in this embodiment for the dynamics of measured signal's shape of corona 307. Spikes around corona 307 may represent lightning strikes in the vicinity of the yacht and are easily discerned from a corona development. Such a build-up allows for the output mechanism 180 to determine which output signals qualify 613 as an qualified event signal QS, providing ample time for an automated system to alert users, and deactivate 715 sensitive electronic equipment in response to the qualified event signal QS. Following an alert, or if no qualified event signal was detected, the system 100 continues to operate monitoring additional intercepted electromagnetic signals 605.

In a second embodiment, illustrated in FIG. 6 as the dashed box 620 containing logic steps 609*b*, 617, 617*b*, and 619, the system according to the present invention comprises multiple transformation modules 130, 130*b*, FIG. 1C, and the input signals 119 are converted to at least two selected signals 609 and 609*b*. The at least two selected signals are delivered, steps 617 and 617*b*, to a logic module LG. If the at least two passed signals satisfy the logic of logic module LG, step 619, then the selected signals are converted to output signals, step 610 and are delivered to the output mechanism, step 611, as done above.

Example 2

A second specific embodiment will now be shown in more detail. The corona build-up device and system disclosed herein can be used to detect corona build-up on components of electrical power systems, for example high voltage power lines, power generating stations and substations. In this embodiment, a system 400 is used to detect corona build-up and subsequent discharges of a corona-attractor. The corona attractor, referred herein as the attractor CA is a component well-suiting for attracting a corona. A high voltage generator HVG simulates components in an electrical power relay system, where one produces an electrical field, and the other accepts or attracts discharge arcs. The attractor CA includes a Shakespeare Mariner 4200 three-inch VHF sailboat antenna 403, and connected to fifty feet of RG-8U cable 116 terminating in a 50 ohm load connected to a ground 405. The high voltage generator HVG includes a grounded 407 model 50E High voltage generator capable of a maximum voltage output of 49 kV. The coupling mechanism 110 of a corona detector 400 is applied to the RG-8U cable 116, the transforming module tuned to monitor at a frequency of 2182 kHz and sampling at 1 Hz.

Figure 5A:
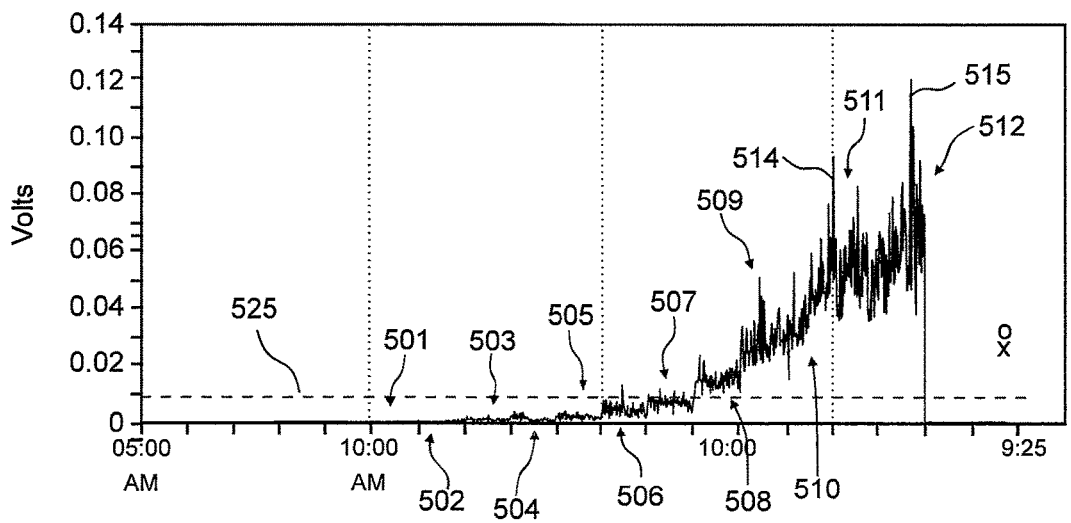
FIGS. 5A and 5B are graphs representing a recording of a man-made corona build-up from one embodiment, with a one-and-one-quarter of an inch air gap.
Figure 5B:
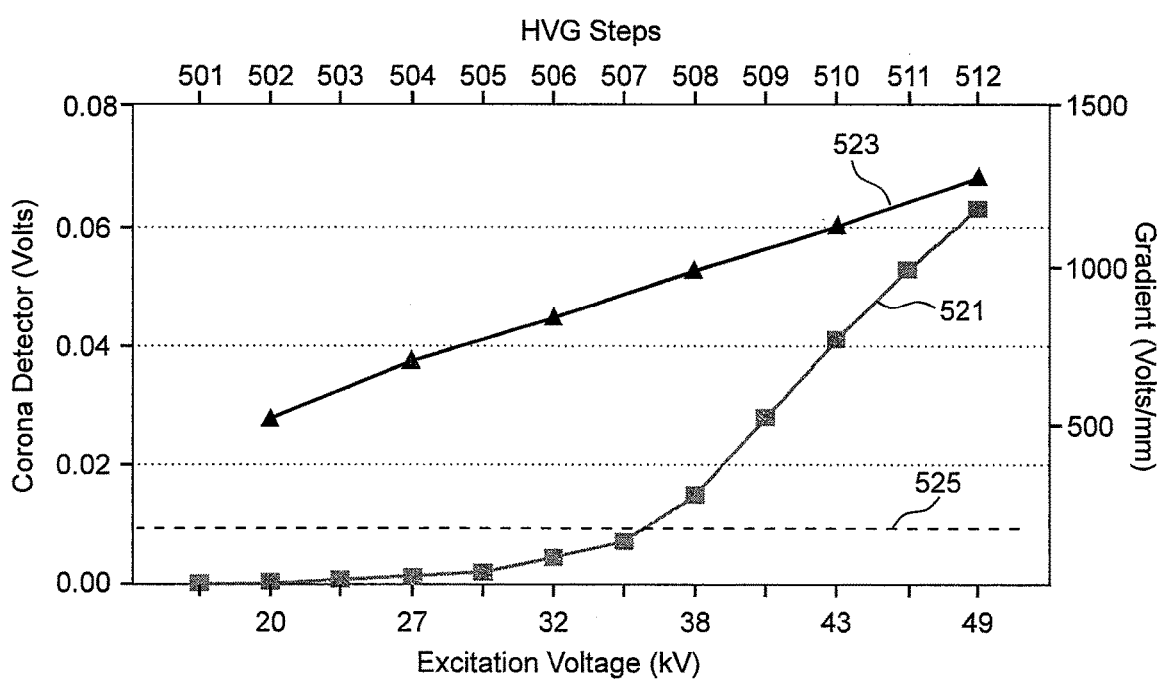

To simulate different amounts of electricity moving through a power line, the high voltage generator HVG was excited at increasingly larger voltages for a number of steps and recorded by the corona detector 400, with an air gap of one and one quarter (1¼) inches. A sample recording of the system shown in FIG. 4A is illustrated in FIG. 5A, and graphed in FIG. 5B with steps 501-512 as the top X-axis and resulting system recording illustrated as grey squares and line 521. Each step is a recording from the corona detector 400, each lasting approximately one minute long, and being recorded after progressively higher excitation voltage steps (step 501 corresponds to zero volts and steps 502 to 512 correspond to from 20,000 Volts to 49,000 Volts) and as illustrated in FIG. 5B utilizing the bottom X-axis. As excitation voltage increases, the electric field around the generator HVG increases, inducing a corona on the attractor CA, seen as sustained, increased voltage during step 508 and above. The sustained increased voltage is marked with dashed line 525. In many embodiments, the system can be set to trigger an output or action at a certain sustained voltage level or slope of voltage increase as a function of time. In this embodiment, dashed line 525 at approximately 0.01 volts, represents the definition of a corona in the environment. Arching and corona discharges 514 and 515 are seen at higher generator HVG steps, increasing with frequency and intensity the higher the generator voltage.

FIG. 5B illustrates the generator HVG voltage output steps, numbered identically for items also shown in FIG. 5A, and illustrated as plot line 521, plotted against left Y-axis, as Corona Detector in Volts. Also illustrated in FIG. 5B are the gradient values between corona attractor CA and high voltage generator HVG, as illustrated by plot line 523, FIG. 5B termed voltage gradient and measured in volts per millimeter. These readings range in values from 524 to 1286, and are shown with reference to the right Y-axis. Corona threshold line 525 is also depicted in FIG. 5B.

Example 3

Figure 7A:
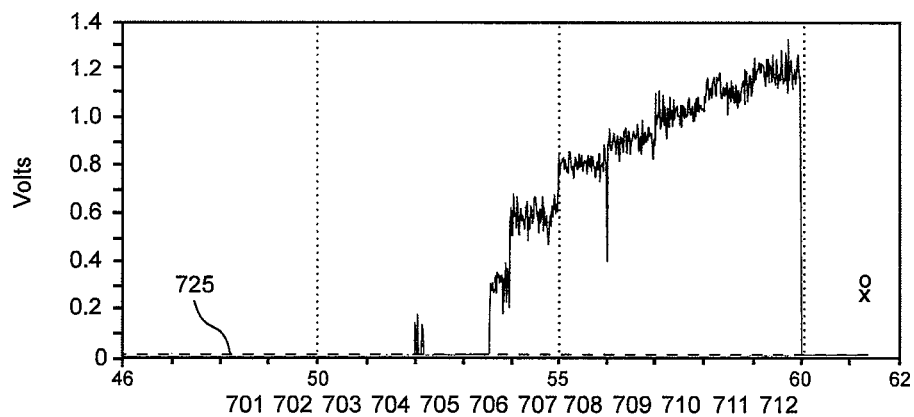
FIGS. 7A and 7B are graphs representing a recording of a man-made corona build-up from one embodiment with a three-eighths of an inch air gap.
Figure 7B:
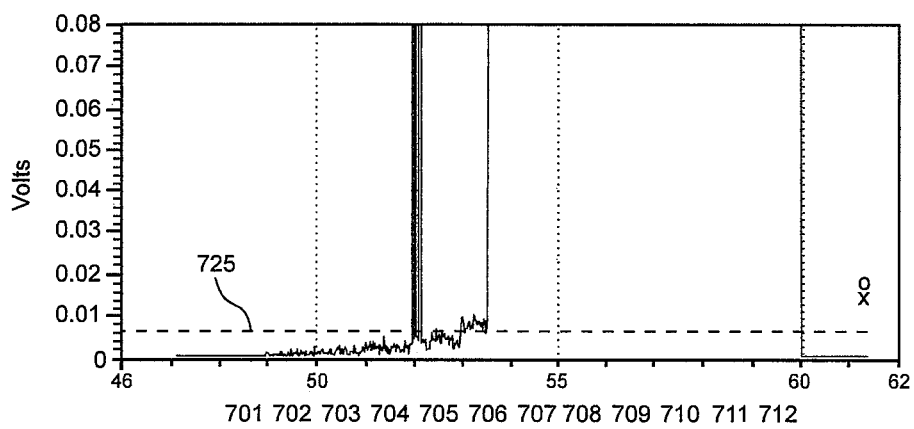

A third example is presently presented. The exact setup as described in Example 2 was produced, excepting that the air gap between corona attractor CA and high voltage generator HVG was three-eighths (⅜) of an inch. The high voltage generator was run as described above for excitation steps of 20 to 49 kV and the corona detector 400 recorded output in the same fashion as above. Illustrated in FIGS. 7A and 7B are a recording with two different Y-axes. FIG. 7A shows all of excitation voltage steps tested 701-712 (step 501 corresponds to zero volts and steps 502 to 512 correspond to 20,000 Volts to 49,000 Volts), showing steps 506 to 512 in range. FIG. 7B shows the range that steps 701 to 705 are within. Similar to Example 2, a threshold line 725 illustrates a threshold limit the corona detector may be set at to trigger a qualified signal and audible alarm. Furthermore, the corona gradient reached 3 kV/mm during Step 506, which is considered the threshold needed for lightning strikes to occur in nature.

Applications

The instant invention may be utilized in any suitable manner as desired. Several notable applications are described herein. The method of measuring the RF signal noise generated by intense electrical corona activity associated with a lightning storm for the purpose of detecting the potential of a lightning strike, before said strike. Using the electrical wiring system of a vessel as the antenna for the detection of the corona RF signal. Monitoring the RF signal in the wiring using an inductive coupling technique. The coupling device may be a transformer formed using a split ferrite core with several turns of conductor wound through the core. The split core would be placed over a cable in the wiring of a ship (or other vehicle or structure), such as the coaxial cable running between the VHF Transceiver and the masthead antenna. Using the output of the device disclosed herein to turn on a visual or audio alarm. The Corona detector disclosed herein can be used in numerous other applications at sea and on land, such as monitoring buildings for susceptibility to lightning strike, or to automatically turn off electrical equipment when subject to potential lightning strike.

In some embodiments, the design described herein is a simple diode crystal receiver. It is used to conserve power since it operates on energy derived from the RF signal. Any receiver type could be used based on considerations of power needs, size, cost and complexity.

The monitoring frequency of the disclosed detector can be any frequency not normally used by government, industry or the public. An optimal channel is to be clear of other signals so as not to interfere with the electrical event (e.g. corona) detection. The Corona Detector disclosed herein may have application for monitoring munitions storage sites. The Corona Detector may provide a method to monitor electrostatic conditions at the time of missile firing to prevent a lightning strike down the gaseous and hot missile track. Such a strike may follow the path directly to the missile launching turret.

Although specific features of the present invention are shown in some drawings and not in others, this is for convenience only, as each feature may be combined with any or all of the other features in accordance with the invention. While there have been shown, described, and pointed out fundamental novel features of the invention as applied to a preferred embodiment thereof, it will be understood that various omissions, substitutions, and changes in the form and details of the devices illustrated, and in their operation, may be made by those skilled in the art without departing from the spirit and scope of the invention. For example, it is expressly intended that all combinations of those elements and/or steps that perform substantially the same function, in substantially the same way, to achieve the same results be within the scope of the invention. Substitutions of elements from one described embodiment to another are also fully intended and contemplated. It is also to be understood that the drawings are not necessarily drawn to scale, but that they are merely conceptual in nature.

It is to be understood that the foregoing embodiments are provided as illustrative only, and do not limit or define the scope of the invention. Various other embodiments, including but not limited to the following, are also within the scope of the claims. For example, elements and components described herein may be further divided into additional components or joined together to form fewer components for performing the same functions. Any of the functions disclosed herein may be implemented using means for performing those functions. Such means include, but are not limited to, any of the components disclosed herein, such as the computer-related components described below.

The techniques described above may be implemented, for example, in hardware, one or more computer programs tangibly stored on one or more computer-readable media, firmware, or any combination thereof. The techniques described above may be implemented in one or more computer programs executing on, or executable by, a programmable computer including any combination of any number of the following: a processor, a storage medium readable and/or writable by the processor (including, for example, volatile and non-volatile memory and/or storage elements), an input device, and an output device. The input device and/or the output device form a user interface in some embodiments. Program code may be applied to input entered using the input device to perform the functions described and to generate output using the output device.

Any claims herein which affirmatively require a computer, a processor, a controller, a memory, or similar computer-related elements, are intended to require such elements, and should not be interpreted as if such elements are not present in or required by such claims. Such claims are not intended, and should not be interpreted, to cover methods and/or systems which lack the recited computer-related elements. For example, any method claim herein which recites that the claimed method is performed by a computer, a processor, a controller, a memory, and/or similar computer-related element, is intended to, and should only be interpreted to, encompass methods which are performed by the recited computer-related element(s). Such a method claim should not be interpreted, for example, to encompass a method that is performed mentally or by hand (e.g., using pencil and paper). Similarly, any product claim herein which recites that the claimed product includes a computer, a processor, a memory, and/or similar computer-related element, is intended to, and should only be interpreted to, encompass products which include the recited computer-related element(s). Such a product claim should not be interpreted, for example, to encompass a product that does not include the recited computer-related element(s).

Each computer program within the scope of the claims below may be implemented in any programming language, such as assembly language, machine language, a high-level procedural programming language, or an object-oriented programming language. The programming language may, for example, be a compiled or interpreted programming language.

Each such computer program may be implemented in a computer program product tangibly embodied in a machine-readable storage device for execution by a computer processor. Method steps of the invention may be performed by one or more computer processors executing a program tangibly embodied on a computer-readable medium to perform functions of the invention by operating on input and generating output. Suitable processors include, by way of example, both general and special purpose microprocessors. Generally, the processor receives (reads) instructions and data from a memory (such as a read-only memory and/or a random-access memory) and writes (stores) instructions and data to the memory. Storage devices suitable for tangibly embodying computer program instructions and data include, for example, all forms of non-volatile memory, such as semiconductor memory devices, including EPROM, EEPROM, and flash memory devices; magnetic disks such as internal hard disks and removable disks; magneto-optical, disks; and CD-ROMs. Any of the foregoing may be supplemented by, or incorporated in, specially-designed ASICs (application-specific integrated circuits) or FPGAs (Field-Programmable Gate Arrays).

A computer can generally also receive (read) programs and data from, and write (store) programs and data to, a non-transitory computer-readable storage medium such as an internal disk (not shown) or a removable disk or flash memory. These elements will also be found in a conventional desktop or workstation computer as well as other computers suitable for executing computer programs implementing the methods described herein, which may be used in conjunction with any digital print engine or marking engine, display monitor, or other raster output device capable of producing color or gray scale pixels on paper, film, display screen, or other output medium or other type of user interface. Any data disclosed herein may be implemented, for example, in one or more data structures tangibly stored on a non-transitory computer-readable medium. Embodiments of the invention may store such data in such data structure(s) and read such data from such data structure(s).

It is the intention, therefore, to be limited only as indicated by the scope of the claims appended hereto. Other embodiments will occur to those skilled in the art and are within the following claims.

What is claimed is:

1. A system for detecting electrical events in an environment, the system comprising:
    a conductive substrate capable of intercepting electromagnetic signals from the environment across a selected spectrum of frequencies;
    a coupling mechanism configured to establish an inductively-coupled electromagnetic connection with said conductive substrate to receive at least one intercepted electromagnetic signal from said conductive substrate;
    a detector circuit including a first transforming module configured to select a first frequency from said at least one intercepted signal, and to convert said selected first frequency into at least one selected signal; and
    an output mechanism electrically connected to said detector circuit to receive said at least one selected signal and configured to produce at least one of (i) a perceptible warning, (ii) a warning signal, or (iii) a stored signal; and
    wherein said coupling mechanism has at least inductive and resistive frequency ranges across the selected spectrum of frequencies, and said coupling mechanism receives said at least one intercepted electromagnetic signal within said inductive frequency range.

2. The system of claim 1 wherein said detector circuit further comprises:
    a second transforming module, configured to select a second frequency from said at least one intercepted signal and to convert said selected second frequency to at least one second selected signal; and
    a logic module which receives the at least one selected signal and the at least one second selected signal, and produces at least one output signal which is sent to said output mechanism.

3. The system of claim 2 wherein the logic module includes:
    a logic gate having a first input and a second input and connected to said output mechanism, said first input connected to said first transforming module and said second input connected to said second transforming module; and
    wherein said first input receives said at least one selected signal from said first transforming module and said second input receives said at least one second selected signal.

4. The system of claim 1 wherein said coupling mechanism is a split core ferrite transformer.

5. The system of claim 1 further comprising a protection mechanism physically connected with at least one connection of at least one piece of electronic equipment and said protection mechanism is adapted to mechanically disconnect said at least one connection when a warning signal is sent to said protection mechanism from said output mechanism.

6. The system of claim 1 wherein said detector circuit further comprises an enhancement module configured to shunt excess intercepted electromagnetic signal via signal-to-ground conduction.

7. The system of claim 6 wherein said detector circuit further comprises an input module, wherein said input module receives said intercepted signal, producing at least one input signal and provides said at least one input signal to said transforming module, and said transforming module performs permeability tuning of said intercepted signal to produce at least one passed signal.

8. The system of claim 1 wherein said output mechanism comprises a data logger and a digital display.

9. The system of claim 1 wherein said output mechanism comprises a communications system to transmit the warning signal.

10. The system of claim 1 wherein said output mechanism qualifies said at least one output signal according to at least one test criteria to produce one of a qualified event signal or a non-qualified event signal.

11. A method of detecting electrical events, comprising the steps of:
selecting a device comprising a coupling mechanism configured to receive electromagnetic signals across a selected spectrum of frequencies, and a detector circuit including a first transforming module configured to select a first frequency from a received electromagnetic signal and to convert said selected first frequency into at least one selected signal, wherein said coupling mechanism has at least inductive and resistive frequency ranges across the selected spectrum of frequencies;
connecting said device to an output mechanism configured to receive at least one signal from said detector circuit;
coupling said coupling mechanism with an inductive connection to a conductive substrate found in the environment, said conductive substrate capable of intercepting electromagnetic signals from the environment;
intercepting electromagnetic signals from the environment with said coupling mechanism, and said coupling mechanism receives said at least one intercepted electromagnetic signal within said inductive frequency range;
producing at least one signal from the detector circuit; and
receiving said at least one signal with the output mechanism.

12. The method of claim 11 further comprising the steps of
qualifying said at least one signal according to at least one test criteria by said output mechanism; and
producing one of a qualified event signal or a non-qualified event signal.

13. The method of claim 11 wherein said device is selected to include a protection mechanism and the method further includes the step of physically disconnecting at least one connection from at least one piece of electronic equipment utilizing said protection mechanism.

14. The method of claim 11 wherein said output mechanism further comprises an interconnected communications system and the method further includes the step of communicating said at least one signal to a remote station.

15. The method of claim 11 wherein said detector circuit further comprises an enhancement module configured to shunt excess selected signal to ground.

16. The method of claim 15, further comprising the step of shunting excess selected signal to ground.

17. The method of claim 11, wherein said detector circuit further comprises an input module; wherein said input module receives said intercepted signal, producing at least one input signal and provides said at least one input signal to said transforming module, said transforming module performs permeability tuning of said intercepted signal, producing said at least one selected signal.

18. The method of claim 11, wherein said detector circuit further comprises:
a second transforming module, configured to select a second frequency from said at least one intercepted signal and to convert said selected second frequency to at least one second selected signal;
a logic gate comprising a first and a second input and connected to said output mechanism, said first input connected to said first transforming module and said second input connected to said second transforming module; and
wherein said first input receives said at least one selected signal from said first transforming module and said second input receives said at least one second selected signal and wherein said logic gate produces at least one output signal, sending said at least one output signal to said output mechanism.

19. A system for detecting electrical events in an environment, the system comprising:
a conductive substrate capable of intercepting electromagnetic signals from the environment across a selected spectrum of frequencies;
a coupling mechanism configured to establish an inductively-coupled electromagnetic connection with said conductive substrate to receive at least one intercepted electromagnetic signal from said conductive substrate;
a detector circuit including a first transforming module configured to select a first frequency from said at least one intercepted signal, and to convert said selected first frequency into at least one selected signal; and
an output mechanism electrically connected to said detector circuit to receive said at least one selected signal and configured to produce at least one of (i) a perceptible warning, (ii) a warning signal, or (iii) a stored signal;
wherein said detector circuit further comprises:
a second transforming module, configured to select a second frequency from said at least one intercepted signal and to convert said selected second frequency to at least one second selected signal; and
a logic module which receives the at least one selected signal and the at least one second selected signal, and produces at least one output signal which is sent to said output mechanism; and
wherein the logic module includes:
a logic gate having a first input and a second input and connected to said output mechanism, said first input connected to said first transforming module and said second input connected to said second transforming module; and
wherein said first input receives said at least one selected signal from said first transforming module and said second input receives said at least one second selected signal.

* * * * *